United States Patent
Doppalapudi et al.

(10) Patent No.: US 10,784,845 B2
(45) Date of Patent: Sep. 22, 2020

(54) ERROR DETECTION AND COMPENSATION FOR A MULTIPLEXING TRANSMITTER

(71) Applicant: MACOM Technology Solutions Holdings, Inc., Lowell, MA (US)

(72) Inventors: Naga Rajesh Doppalapudi, Santa Clara, CA (US); Echere Iroaga, Santa Clara, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 16/143,493

(22) Filed: Sep. 27, 2018

(65) Prior Publication Data
US 2020/0106429 A1 Apr. 2, 2020

(51) Int. Cl.
| | |
|---|---|
| H03K 5/156 | (2006.01) |
| H04B 17/15 | (2015.01) |
| H03K 5/05 | (2006.01) |
| H03K 5/135 | (2006.01) |
| H03K 5/00 | (2006.01) |

(52) U.S. Cl.
CPC .............. *H03K 5/1565* (2013.01); *H03K 5/05* (2013.01); *H03K 5/135* (2013.01); *H04B 17/15* (2015.01); *H03K 2005/00286* (2013.01)

(58) Field of Classification Search
CPC ......... H03K 5/1565; H03K 3/017; H03K 7/08
See application file for complete search history.

(56) References Cited

U.S. PATENT DOCUMENTS

| | | | |
|---|---|---|---|
| 8,422,478 B2 | 4/2013 | Okamoto | |
| 8,432,936 B2 | 4/2013 | Ling | |
| 8,726,131 B2 | 5/2014 | Jongren et al. | |
| 8,848,747 B2 | 9/2014 | Zeng et al. | |
| 8,976,838 B2 | 3/2015 | Jaeckel et al. | |
| 9,237,001 B1* | 1/2016 | Song ..................... H04L 7/0016 |
| 9,634,743 B2 | 4/2017 | Sun | |
| 2004/0161068 A1* | 8/2004 | Zerbe ....................... G11C 7/22 |
| | | | 375/355 |
| 2008/0036509 A1* | 2/2008 | Jang ....................... H03K 5/135 |
| | | | 327/141 |

(Continued)

OTHER PUBLICATIONS

Frans et al, A 40-to-64 Gbs NRZ Transmitter With Supply-Regulated Front-End in 16 nm FinFET, IEEE Journal of Solid-State Circuits, vol. 51, No. 12, Dec. 2016.

*Primary Examiner* — Sophia Vlahos

(57) ABSTRACT

Various aspects provide for error detection and compensation for a multiplexing transmitter. For example, a system can include an error detector circuit and a duty cycle correction circuit. The error detector circuit is configured to measure duty cycle error for a clock associated with a transmitter to generate error detector output based on a clock pattern for output generated by the transmitter in response to a defined bit pattern. The duty cycle correction circuit is configured to adjust the clock associated with the transmitter based on the error detector output. Additionally or alternatively, the error detector circuit is configured to measure quadrature error between an in-phase clock and a quadrature clock in response to the defined bit pattern. Additionally or alternatively, the system can include a quadrature error correction circuit configured to adjust phase shift between the in-phase clock and the quadrature clock based on quadrature error.

12 Claims, 10 Drawing Sheets

(56) References Cited

U.S. PATENT DOCUMENTS

| | | | |
|---|---|---|---|
| 2017/0033774 A1* | 2/2017 | Hedayati | H03K 3/017 |
| 2019/0123728 A1* | 4/2019 | Zhao | H03K 5/1565 |
| 2019/0215146 A1* | 7/2019 | Ke | H03K 5/1565 |
| 2019/0272804 A1* | 9/2019 | Amirkhany | G09G 5/008 |

* cited by examiner

ERROR DETECTION AND COMPENSATION FOR A MULTIPLEXING TRANSMITTER

TECHNICAL FIELD

The subject disclosure relates generally to electronic circuits, and more particularly to transmitter circuitry.

BACKGROUND

With ever increasing demand for higher data rates, operational speeds of transmitters continue to increase. In an example, multiplexers can be employed in a transmitter fabricated via a Complementary Metal-Oxide-Semiconductor (CMOS) process. However, conventional high speed full-rate multiplexers are power hungry and pose numerous implementation challenges in high frequency clock distribution circuits. Furthermore, conventional half-rate multiplexing architectures are sensitive to clock duty cycle error. Moreover, quarter-rate multiplexers are sensitive to both duty cycle error and quadrature error with respect to clocks. As such, conventional multiplexers and/or conventional transmitters that employ multiplexers can be improved.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a system for reducing error associated with a multiplexing transmitter comprises an error detector circuit and a duty cycle correction circuit. The error detector circuit is configured to measure duty cycle error for a clock associated with a transmitter to generate error detector output based on a clock pattern for output generated by the transmitter in response to a defined bit pattern. The duty cycle correction circuit is configured to adjust the clock associated with the transmitter based on the error detector output.

In another example embodiment, a system for reducing error associated with a multiplexing transmitter comprises an error detector circuit and a quadrature error correction circuit. The error detector circuit is configured to measure quadrature error between an in-phase clock and a quadrature clock associated with a transmitter to generate error detector output based on a clock pattern for output generated by the transmitter in response to a defined bit pattern. The quadrature error correction circuit is configured to adjust phase shift between the in-phase clock and the quadrature clock based on the quadrature error.

In yet another example embodiment, a method comprises providing a first defined bit pattern to a transmitter. The method also comprises determining first error data associated with duty cycle distortion for an in-phase clock provided to the transmitter. Furthermore, the method comprises adjusting the in-phase clock for the transmitter based on the first error data. The method also comprises adjusting a quadrature clock for the transmitter based on second error data associated with duty cycle distortion for the quadrature clock that is determined in response to a second defined bit pattern provided to the transmitter.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
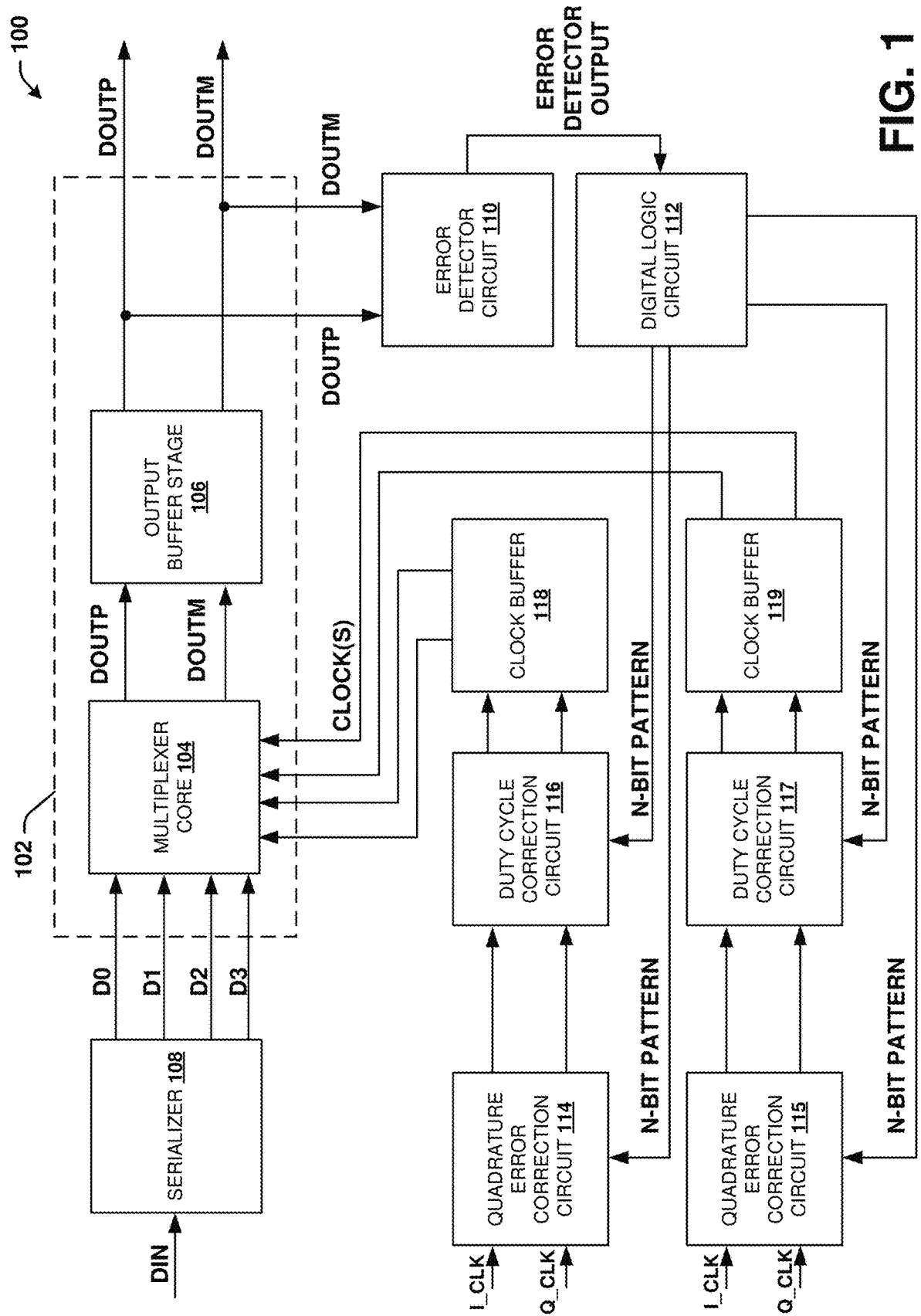
FIG. 1 illustrates an example, non-limiting embodiment of a system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

The emergence of high-speed mobile connectivity, cloud computing, storage applications, etc. has significantly increased demand for higher data transfer speeds in carrier networks as well as in data centers. To provide the higher data transfer speeds, an optical transceiver can employ PAM-4 and/or Forward Error Correction (FEC) schemes to achieve data rates beyond, for example, 100 Gbps over single-A of a communication fiber. Alternatively, a coherent transceiver can employ dual polarization and/or higher-order modulation schemes to support, for example, data rates beyond 400 Gbps per A. In both these cases, high speed transmitters utilizing multiplexers can be employed. A multiplexer is an electronic device that selects a signal from a group of signals (e.g., a group of signals received as input) and outputs the selected signal. In high speed multiplexing transmitters, multiplexers can be used to sequentially select between lower speed input signals in order to produce a combined output at a higher speed. In order to achieve this, high speed clock creation and distribution is required. However, high-speed clock generation and/or high-speed clock distribution is generally difficult to achieve with conventional transceivers and/or conventional multiplexers due to increased error (e.g., increased duty cycle error and/or increased quadrature error) with an increase in operational speeds.

To address these and/or other issues, one or more embodiments described herein provide error detection and/or error compensation for a multiplexing transmitter, which offers a number of benefits relative to conventional techniques and/or conventional transmitters. For instance, a Complementary Metal-Oxide-Semiconductor (CMOS) multiplexing transmitter circuit implementation can be provided that can increase operational speeds and/or reduce error. In an aspect, a CMOS quarter-rate multiplexing transmitter for high-speed serial links can be provided. In an embodiment, detection and compensation for duty-cycle errors and/or quadrature errors can be provided by employing one or more embodiments described herein. For instance, a duty cycle detector circuit can be employed at an output of a transmitter. During a calibration mode, a defined bit pattern can be applied to input of the transmitter input and duty cycle detector output can be fed back to a set of error correction circuits (e.g., a set of duty cycle correction circuits and/or a set of quadrature error correction circuits) through control switching logic. For example, error can be measured at the transmitter output in order to compensate for any errors in a data path along with a clock path. Furthermore, the same detector can be employed for correcting both quadrature error and duty-cycle error. In certain embodiments, duty cycle correction can be performed on an in-phase clock for the transmitter during a first calibration mode, duty cycle correction can be performed on a quadrature clock for the transmitter during a second calibration mode, and/or quadrature error correction can be performed between the in-phase clock and the quadrature clock during a third calibration mode. As such, performance of a multiplexing transmitter can be improved. Additionally, error associated with a multiplexing transmitter can be reduced. For instance, duty cycle error and/or quadrature error associated with a multiplexing transmitter can be reduced. Moreover, increased operational speeds of a multiplexing transmitter while also reducing error can be achieved.

Turning now to FIG. 1, a block diagram illustrating an example, non-limiting embodiment of a system 100 in accordance with various aspects described herein is shown. The system 100 can be a transmitter system such as, for example, a multiplexing transmitter system. In an embodiment, the system 100 can be a multiplexing transmitter system with quadrature error detection and/or a duty cycle detection. The system 100 includes a transmitter 102. The transmitter 102 can include a multiplexer core 104 and an output buffer stage 106. The transmitter 102 can receive a set of data signals D0-D3. For example, the transmitter 102 can receive a data signal D0, a data signal D1, a data signal D2, and a data signal D3. The set of data signals D0-D3 can be, for example, a set of data streams with a defined number of bits. In an embodiment, the set of data signals D0-D3 can be a set of pseudo-random binary sequence data streams. For example, the set of data signals D0-D3 can be single-bit data streams at a particular data rate (e.g., 14 GHz for a 56 Gbps transmitter, etc.). However, it is to be appreciated that the set of data signals D0-D3 can be formatted as different types of data streams. The serializer 108 can convert a DIN signal (e.g., DIN shown in FIG. 1) into the set of data signals D0-D3. The DIN signal can be, for example, a low speed parallel data stream. In an embodiment, the DIN signal can include 64 bits. As such, in a non-limiting example, the serializer 108 can be a 64:4 serializer. However, it is to be appreciated that, in certain embodiments, the DIN signal can include another number of bits. Furthermore, it is to be appreciated that, in certain embodiments, the serializer 108 can be a different type of serializer. In an embodiment, the serializer 108 can sample the DIN signal at a particular sample rate to generate the set of data signals D0-D3. In an embodiment, the set of data signals D0-D3 provided by the serializer 108 can be a defined bit pattern. For example, the set of data signals D0-D3 provided by the serializer 108 can be a four-bit defined bit pattern such as "1100", "0110", "1010", "1001", "0011", etc. In certain embodiments, a value of the set of data signals D0-D3 can depend on a type of calibration mode being implemented by the transmitter 102.

The multiplexer core 104 of the transmitter 102 can convert the set of data signals D0-D3 into a first output data stream DOUTP (e.g., DOUTP shown in FIG. 1) and a second output data stream DOUTM (e.g., DOUTM shown in FIG. 1). In an aspect, the first output data stream DOUTP can be phase inverted with respect to the second output data stream DOUTM. In another aspect, the first output data stream DOUTP and second output data stream DOUTM can be differential output of the multiplexer core 104. The multiplexer core 104 can be, for example, a complementary metal-oxide-semiconductor (CMOS) multiplexer. For example, the multiplexer core 104 can be a CMOS quarter-rate multiplexer. In a non-limiting example, the multiplexer core 104 can correspond to a 4:1 multiplexer. The output buffer stage 106 of the transmitter 102 can process the first output data stream DOUTP and the second output data stream DOUTM for transmission. For instance, the output buffer stage 106 can drive the first output data stream DOUTP and the second output data stream DOUTM. The output buffer stage 106 can be, for example, a differential circuit with differential input and differential output. In an aspect, the output buffer stage 106 can increase power of the first output data stream DOUTP and the second output data stream DOUTM without altering a value of the first output data stream DOUTP and the second output data stream DOUTM. In one example, the first output data stream DOUTP can be a first data stream at 10 Gb/s and the second output data stream DOUTM can be a second data stream at 10 Gb/s. Furthermore, the first output data stream DOUTP and the second output data stream DOUTM can be different data signals. However, it is to be appreciated that the first output data stream DOUTP and/or the second output data stream DOUTM can be a different type of data signal.

The system 100 also includes an error detector circuit 110 and a digital logic circuit 112. The error detector circuit 110 can monitor differential output of the transmitter 102. In an embodiment, the error detector circuit 110 can measure duty cycle error for a clock associated with the transmitter 102 to generate error detector output (e.g., ERROR DETECTOR OUTPUT shown in FIG. 1) based on a clock pattern for the first output data stream DOUTP and/or the second output data stream DOUTM generated by the transmitter 102 in response to a defined bit pattern associated with the set of data signals D0-D3. For instance, the error detector circuit can measure duty cycle error for an in-phase clock (e.g., I_CLK) associated with the transmitter 102 to generate the error detector output based on an in-phase clock pattern for the first output data stream DOUTP and/or the second output data stream DOUTM generated by the transmitter 102 in response to a defined bit pattern associated with the set of data signals D0-D3. Additionally or alternatively, the error detector circuit can measure duty cycle error for a quadrature clock (e.g., Q_CLK) associated with the transmitter 102 to generate the error detector output based on a quadrature clock pattern for the first output data stream DOUTP and/or the second output data stream DOUTM generated by the transmitter 102 in response to a defined bit pattern associated with the set of data signals D0-D3. As such, the error detector circuit 110 can determine error associated with the first output data stream DOUTP and/or the second output data stream DOUTM.

In an embodiment, the error detector circuit 110 can be a duty-error detection circuit that determines duty-cycle error associated with the first output data stream DOUTP and/or the second output data stream DOUTM. In an aspect, the error detector circuit 110 can receive the first output data stream DOUTP and the second output data stream DOUTM. Furthermore, the error detector circuit 110 can measure duty cycle error of the first output data stream DOUTP and/or the second output data stream DOUTM. In an embodiment, the error detector circuit 110 can measure duty cycle error associated with the first output data stream DOUTP and/or the second output data stream DOUTM using a comparator. For example, the error detector circuit 110 can compare the first output data stream DOUTP and the second output data stream DOUTM. In another aspect, the error detector circuit 110 can generate the error detector output. The error detector output can include a result of the error associated with the first output data stream DOUTP and/or the second output data stream DOUTM. For example, the error detector output can indicate a type of error associated with the first output data stream DOUTP and/or the second output data stream DOUTM. Additionally or alternatively, the error detector circuit 110 can be a quadrature error detection circuit that determines quadrature error associated with the first output data stream DOUTP and/or the second output data stream DOUTM. For example, the error detector circuit 110 can measure quadrature error between an in-phase clock and a quadrature clock associated with the first output data stream DOUTP and/or the second output data stream DOUTM in response to a defined bit pattern associated with the set of data signals D0-D3.

In another aspect, the error detector circuit 110 can generate an N-bit pattern (e.g., N-BIT PATTERN shown in FIG. 1) based on the error detector output. The N-bit pattern can be a set of bits to perform quadrature error correction and/or duty cycle correction associated with the transmitter 102. For example, a quadrature error correction circuit 114, a quadrature error correction circuit 115, a duty cycle correction circuit 116 and/or a duty cycle correction circuit 117 can receive the N-bit pattern. The quadrature error correction circuit 114 can correct quadrature error associated with an in-phase clock I_CLK (e.g., I_CLK shown in FIG. 1) and/or a quadrature clock Q_CLK (e.g., Q_CLK shown in FIG. 1). Similarly, the quadrature error correction circuit 115 can also correct quadrature error associated with the in-phase clock I_CLK and/or the quadrature clock Q_CLK. The duty cycle correction circuit 116 can correct duty cycle distortion associated with the in-phase clock I_CLK and/or the quadrature clock Q_CLK. Similarly, the duty cycle correction circuit 117 can correct duty cycle distortion associated with the in-phase clock I_CLK and/or the quadrature clock Q_CLK.

In an embodiment, the duty cycle correction circuit 116 and/or the duty cycle correction circuit 117 can adjust the in-phase clock I_CLK and/or the quadrature clock Q_CLK associated with the transmitter 102 based on the error detector output and/or the N-bit pattern. For example, the duty cycle correction circuit 116 and/or the duty cycle correction circuit 117 can adjust the in-phase clock I_CLK and/or the quadrature clock Q_CLK associated with the transmitter 102 based on an amount of duty cycle error indicated by the error detector output and/or the N-bit pattern. Additionally or alternatively, the quadrature error correction circuit 114 and/or the quadrature error correction circuit 115 can adjust phase shift between the in-phase clock I_CLK and the quadrature clock Q_CLK based on the error detector output and/or the N-bit pattern. For example, the quadrature error correction circuit 114 and/or the quadrature error correction circuit 115 can adjust phase shift between the in-phase clock I_CLK and the quadrature clock Q_CLK based on an amount of quadrature error indicated by the error detector output and/or the N-bit pattern. As such, based on the N-bit pattern, one or more clocks (e.g., CLOCK(S) shown in FIG. 1) provided to the multiplexer core 104 of the transmitter 102 can be modified. In an embodiment, the quadrature error correction circuit 114 can be an in-phase clock quadrature error correction circuit, the quadrature error correction circuit 115 can be a quadrature clock quadrature error correction circuit, the duty cycle correction circuit 116 can be an in-phase clock duty cycle correction circuit, and the duty cycle correction circuit 117 can be a quadrature clock duty cycle correction circuit. In certain embodiments, the one or more clocks can be digitally delayed via a clock buffer 118 associated with the duty cycle correction circuit 116 and/or a clock buffer 119 associated with the duty cycle correction circuit 117 to manage a rise time and/or a fall time for the one or more clocks provided to the multiplexer core 104 of the transmitter 102. In an embodiment, the one or more clocks can include a set of quarter rate clock signals. For example, the one or more clocks can include a first quarter rate clock signal (e.g., CK4_0), a second quarter rate clock signal (e.g., CK4_90), a third quarter rate clock signal (e.g., CK4_180), and a fourth quarter rate clock signal (e.g., CK4_270). In certain embodiments, the one or more clocks can control one or more transmission gates of the multiplexer core 104.

In certain embodiments, a calibration mode can be performed where different defined bit patterns are provided to the transmitter 102 via the set of data signals D0-D3 to determine error associated with the transmitter 102. For example, the error detector circuit 110 can measure duty cycle error for a clock associated with the transmitter 102 to generate second error detector output based on a second clock pattern for second output generated by the transmitter 102 in response to an inverted version of the defined bit pattern associated with the set of data signals D0-D3. Additionally, the error detector circuit 110 can determine an average of first error detector output and second error detector output. Furthermore, the error detector circuit 110 can adjust a clock (e.g., the in-phase clock I_CLK and/or the quadrature clock Q_CLK) associated with the transmitter 102 based on the average of the first error detector output and the second error detector output.

In certain embodiments, aspects of the error detector circuit 110 and/or the digital logic circuit 112 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. For example, the error detector circuit 110 and/or the digital logic circuit 112 can include and/or can be in communication with a memory for storing computer executable components and instructions. Furthermore, the error detector circuit 110 and/or the digital logic circuit 112 can include and/or can be in communication with a processor to facilitate operation of the instructions (e.g., computer executable components and instructions) by the system.

Figure 2:
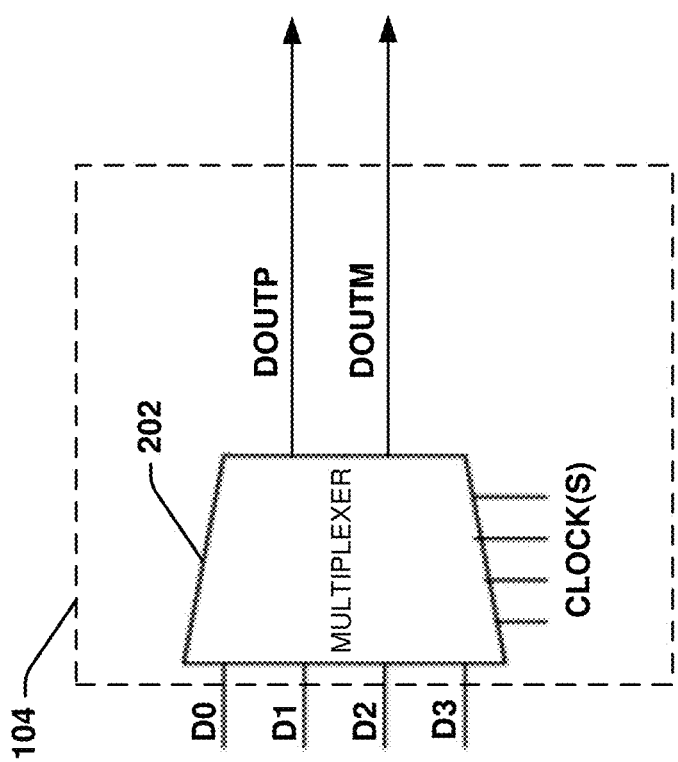
FIG. 2 illustrates an example, non-limiting embodiment of a multiplexing core in accordance with various aspects described herein.

Referring now to FIG. 2, a block diagram illustrating an example, non-limiting embodiment of a system 200 in accordance with various aspects described herein is shown. The system 200 includes the multiplexer core 104. The multiplexer core 104 can include a multiplexer 202. The multiplexer 202 can receive the set of data signals D0-D3. Additionally, the multiplexer 202 can receive the one or more clocks. For example, the set of data signals D0-D3 can include a data signal D0, a data signal D1, a data signal D2, and a data signal D3. The set of data signals D0-D3 can be, for example, a set of data streams with a defined number of bits. In one example, the set of data signals D0-D3 can be a set of pseudo-random binary sequence data streams. For instance, the set of data signals D0-D3 can be single-bit data streams at a particular data rate (e.g., 14 GHz for a 56 Gbps transmitter, etc.). The multiplexer 202 can multiplex the set of data signals D0-D3 into the first output data stream DOUTP. Furthermore, the multiplexer 202 can multiplex the set of data signals D0-D3 into the second output data stream DOUTM. In an embodiment, the set of data signals D0-D3 can be a defined bit pattern. For example, the set of data signals D0-D3 can be a four-bit defined bit pattern such as "1100", "0110", "1010", "1001", "0011", etc. In an embodiment, a value for the set of data signals D0-D3 can depend on a type of calibration mode being performed by the transmitter 102.

Figure 3:
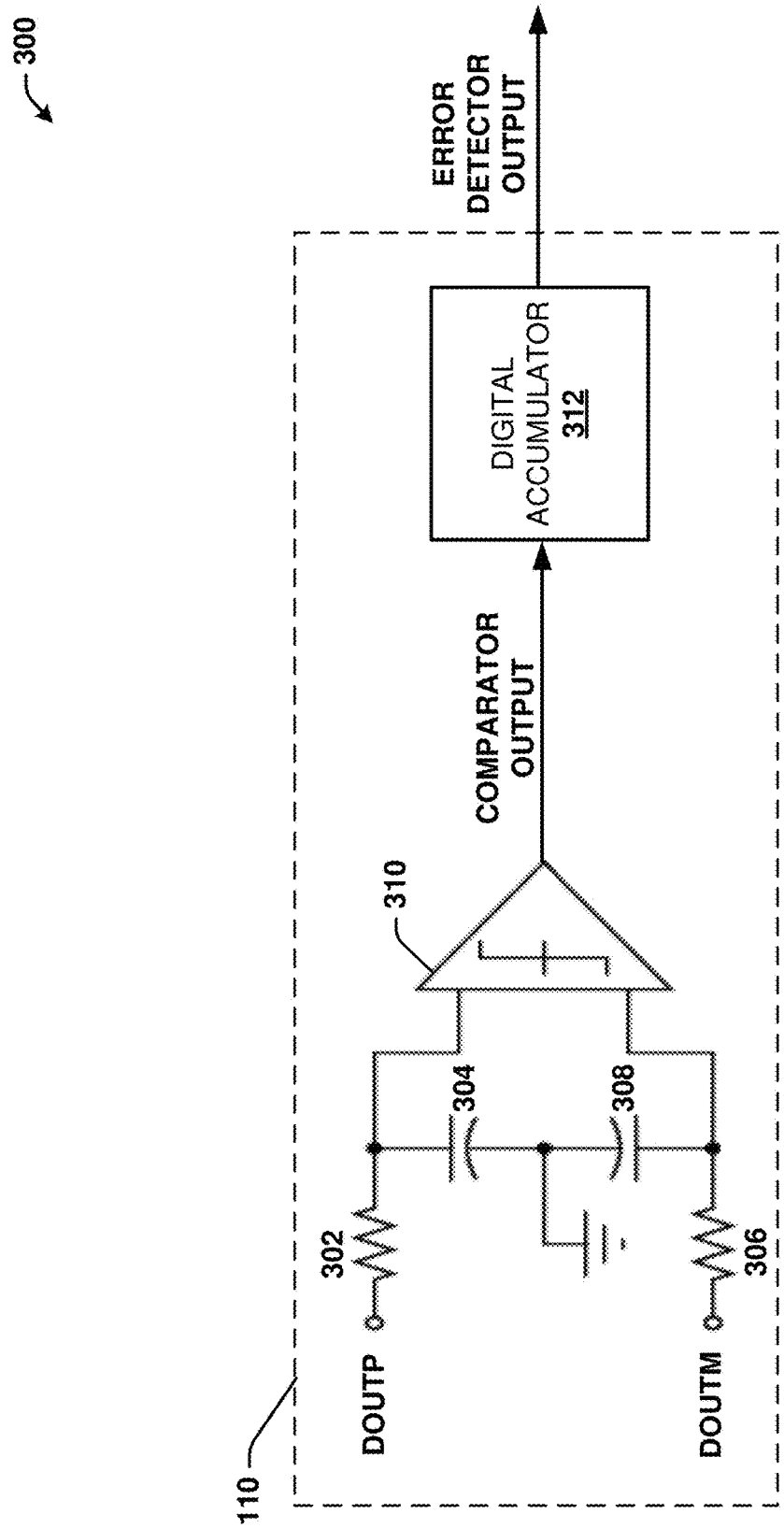
FIG. 3 illustrates an example, non-limiting embodiment of an error detection circuit in accordance with various aspects described herein.

Referring now to FIG. 3, a block diagram illustrating an example, non-limiting embodiment of a system 300 in accordance with various aspects described herein is shown. The system 300 includes the error detector circuit 110. The error detector circuit 110 can include a resistor 302, a capacitor 304, a resistor 306, a capacitor 308, a comparator 310 and/or a digital accumulator 312. The resistor 302 and the capacitor 304 can correspond to a first RC filter. Furthermore, the resistor 306 and the capacitor 308 can correspond to a second RC filter. In an aspect, the first output data stream DOUTP can be provided to the resistor 302. Furthermore, the resistor 302 can be electrically coupled to the capacitor 304 and the comparator 310. The second output data stream DOUTM can be provided to the resistor 306. Furthermore, the resistor 306 can be electrically coupled to the capacitor 308 and the comparator 310. The capacitor 304 can also be electrically coupled to the capacitor 308 and electrical ground. The comparator 310 can compare the first output data stream DOUTP (e.g., the first output data stream DOUTP processed by the first RC filter associated with the resistor 302 and the capacitor 304) and the second output data stream DOUTM (e.g., the second output data stream DOUTM processed by the second RC filter associated with the resistor 306 and the capacitor 308). In an aspect, the first RC filter associated with the resistor 302 and the capacitor 304 can generate an average value of the first output data stream DOUTP. Furthermore, the second RC filter associated with the resistor 306 and the capacitor 308 can generate an average value of the second output data stream DOUTM. As such, in certain embodiments, the comparator 310 can compare the average value of the first output data stream DOUTP to the average value of the second output data stream DOUTM. Based on the comparison of the first output data stream DOUTP and the second output data stream DOUTM, the comparator 310 can generate comparator output (e.g., COMPARATOR OUTPUT shown in FIG. 3). For instance, the comparator output can include data indicative of the comparison of the first output data stream DOUTP and the second output data stream DOUTM. In an example, the comparator 310 can determine if a differential average between the average value of the first output data stream DOUTP to the average value of the second output data stream DOUTM is positive or negative. The comparator output can be provided to the digital accumulator 312. The digital accumulator 312 can convert the comparator output to the error detector output. In an embodiment, the error detector output can be an N-bit pattern. For example, the digital accumulator 312 can accumulate the comparator output to obtain an N-bit pattern associated with the error detector output. The N-bit pattern associated with the error detector output can be, for example, an N-bit word. In an embodiment, the digital accumulator 312 can employ a linear search to convert the comparator output to the error detector output (e.g., an N-bit pattern associated with the error detector output). In another embodiment, the digital accumulator 312 can be implemented as a successive approximation register that employs a binary search to convert the comparator output to the error detector output (e.g., an N-bit pattern associated with the error detector output).

Figure 4:
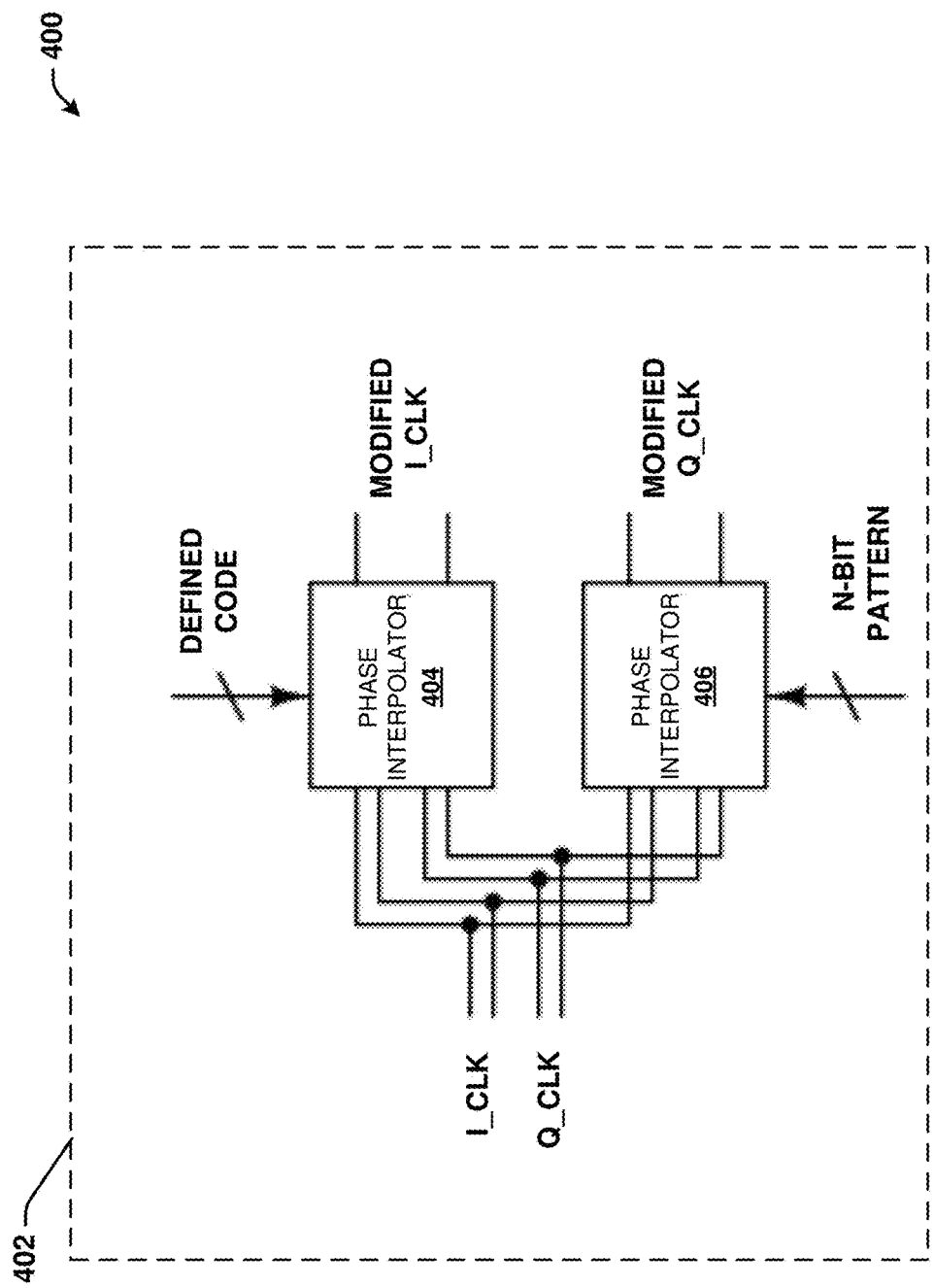
FIG. 4 illustrates an example, non-limiting embodiment of a quadrature error correction circuit in accordance with various aspects described herein.

Referring now to FIG. 4, a block diagram illustrating an example, non-limiting embodiment of a system 400 in accordance with various aspects described herein is shown. The system 400 includes a quadrature error correction circuit 402. The quadrature error correction circuit 402 can correspond to the quadrature error correction circuit 114 and/or the quadrature error correction circuit 115. The quadrature error correction circuit 402 can include a phase interpolator 404 and a phase interpolator 406. The phase interpolator 404 can be an I-clock phase interpolator. The phase interpolator 404 can receive the in-phase clock I_CLK and the quadrature clock Q_CLK. Furthermore, the phase interpolator 404 can receive a defined code (e.g., DEFINED CODE shown in FIG. 4). The defined code can be a defined N-bit value. Based on the in-phase clock I_CLK, the quadrature clock Q_CLK and the defined code, the phase interpolator 404 can generate a modified I_CLK (e.g., MODIFIED I_CLK shown in FIG. 4). The modified I_CLK can be a modified version of the in-phase clock I_CLK. For instance, phase and/or delay of the in-phase clock I_CLK can be modified by the phase interpolator 404 to generate the modified I_CLK. The phase interpolator 406 can be a Q-clock phase interpolator. The phase interpolator 406 can receive the in-phase clock I_CLK and the quadrature clock Q_CLK. Furthermore, the phase interpolator 406 can receive the N-bit pattern. Based on the in-phase clock I_CLK, the quadrature clock Q_CLK and the N-bit pattern, the phase interpolator 406 can generate a modified Q_CLK (e.g., MODIFIED Q_CLK shown in FIG. 4). The modified Q_CLK can be a modified version of the quadrature clock Q_CLK. For instance, phase and/or delay of the quadrature clock Q_CLK can be modified by the phase interpolator 406 to generate the modified Q_CLK. In certain embodiments, the modified I_CLK and/or the modified Q_CLK can be provided to a duty cycle correction circuit (e.g., the duty cycle correction circuit 116 or the duty cycle correction circuit 117). Additionally or alternatively, the modified I_CLK and/or the modified Q_CLK can be provided to the transmitter 102 (e.g., provided to the multiplexer core 104 of the transmitter 102). For example, the modified I_CLK and/or the modified Q_CLK can be included in the one or more clocks provided to the transmitter 102 (e.g., provided to the multiplexer core 104 of the transmitter 102).

Figure 5:
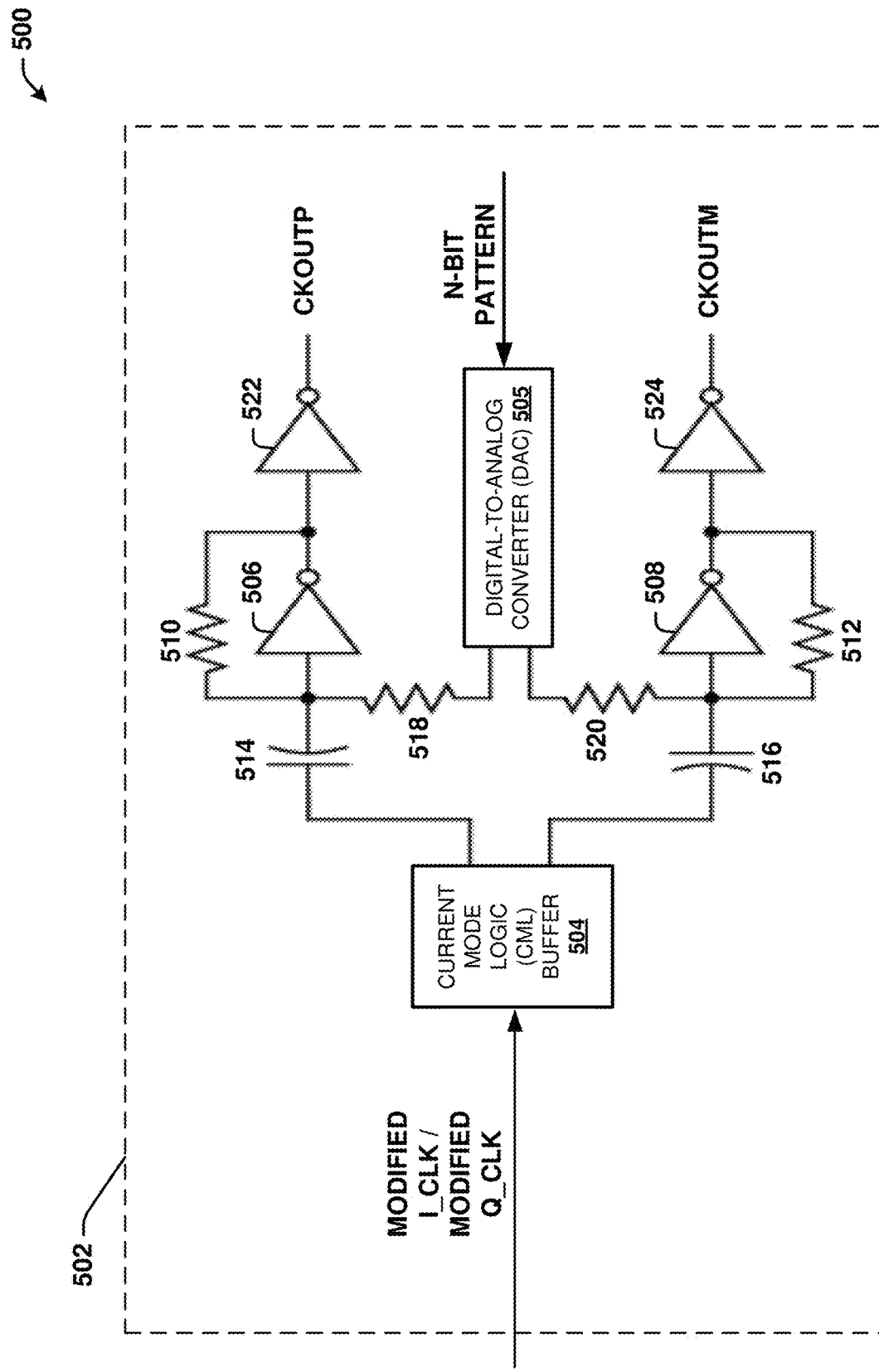
FIG. 5 illustrates an example, non-limiting embodiment of a duty cycle correction circuit in accordance with various aspects described herein.

Referring now to FIG. 5, a block diagram illustrating an example, non-limiting embodiment of a system 500 in accordance with various aspects described herein is shown. The system 500 includes a duty cycle correction circuit 502. In an embodiment, the duty cycle correction circuit 502 can correspond to the duty cycle correction circuit 116. In another embodiment, the duty cycle correction circuit 502 can correspond to the duty cycle correction circuit 117. The duty cycle correction circuit 502 can include a current mode logic (CML) buffer 504 and a digital-to-analog converter (DAC) 505. The CML buffer 504 can receive the modified I_CLK in an embodiment where the duty cycle correction circuit 502 corresponds to the duty cycle correction circuit 116. Alternatively, the CML buffer 504 can receive the modified Q_CLK in an embodiment where the duty cycle correction circuit 502 corresponds to the duty cycle correction circuit 117. In certain embodiments, the modified I_CLK and/or the modified Q_CLK can be processed by the CML buffer 504 to manage a rise time and/or a fall time for the modified I_CLK and/or the modified Q_CLK. The DAC 505 can receive the N-bit pattern. The DAC 505 can convert the N-bit pattern from a digital signal to an analog signal. The duty cycle correction circuit 502 can also include an inverter 506 and an inverter 508. In an embodiment where the duty cycle correction circuit 502 corresponds to the duty cycle correction circuit 116, the inverter 506 can employ resistive feedback via a resistor 510 to convert the modified I_CLK (e.g., a current mode logic input clock) to a first CMOS clock CKOUTP (e.g., CKOUTP shown in FIG. 5) for the transmitter 102. Additionally, the inverter 508 can employ resistive feedback via a resistor 512 to convert the modified I_CLK (e.g., a current mode logic input clock) to a second CMOS clock CKOUTM (e.g., CKOUTM shown in FIG. 5) for the transmitter 102. In an alternate embodiment where the duty cycle correction circuit 502 corresponds to the duty cycle correction circuit 117, the inverter 506 can employ resistive feedback via a resistor 510 to convert the modified Q_CLK (e.g., a current mode logic input clock) to the first CMOS clock CKOUTP for the transmitter 102. Additionally, the inverter 508 can employ resistive feedback via a resistor 512 to convert the modified Q_CLK (e.g., a current mode logic input clock) to the second CMOS clock CKOUTM for the transmitter 102. The first CMOS clock CKOUTP and the second CMOS clock CKOUTM can be included, for example, in the one or more clocks provided to the multiplexer core 104. In certain embodiments, the duty cycle correction circuit 502 can also include a capacitor 514 and/or a capacitor 516. The capacitor 514 can be electrically coupled to the CML buffer 504. Furthermore, the capacitor 514 can be electrically coupled to the inverter 506, the resistor 510 and a resistor 518. The resistor 518 can also be electrically coupled to the DAC 505. The capacitor 516 can be electrically coupled to the CML buffer 504. Furthermore, the capacitor 516 can be electrically coupled to the inverter 508, the resistor 512 and a resistor 520. The resistor 520 can also be electrically coupled to the DAC 505.

In an embodiment, a duty cycle for the first CMOS clock CKOUTP and/or the second CMOS clock CKOUTM can depend on a value of the N-bit pattern. In an aspect, the N-bit pattern can be a threshold voltage for the duty cycle correction circuit 502. For example, the duty cycle correction circuit 502 can be a CML-CMOS converter and the N-bit pattern can be a threshold voltage for the CML-CMOS converter. As such, by digitally adjusting a value of the N-bit pattern, a duty cycle for the first CMOS clock CKOUTP and/or the second CMOS clock CKOUTM can be adjusted. In certain embodiments, the duty cycle correction circuit 502 can also include an inverter 522 and/or an inverter 524. The inverter 522 can be configured to perform logical negation with respect to a data signal (e.g., an inverted version of the modified I_CLK or an inverted version of the modified Q_CLK) received from the inverter 506. For instance, the inverter 522 can be configured as NOT logic gate that inverts an inverted version of the modified I_CLK or an inverted version of the modified Q_CLK to provide the first CMOS clock CKOUTP. Furthermore, the inverter 524 can be configured to perform logical negation with respect to a data signal (e.g., an inverted version of the modified Q_CLK or an inverted version of the modified Q_CLK) received from the inverter 508. For instance, the inverter 524 can be configured as NOT logic gate that inverts an inverted version of the modified Q_CLK or an inverted version of the modified Q_CLK to provide the second CMOS clock CKOUTM.

Figure 6:
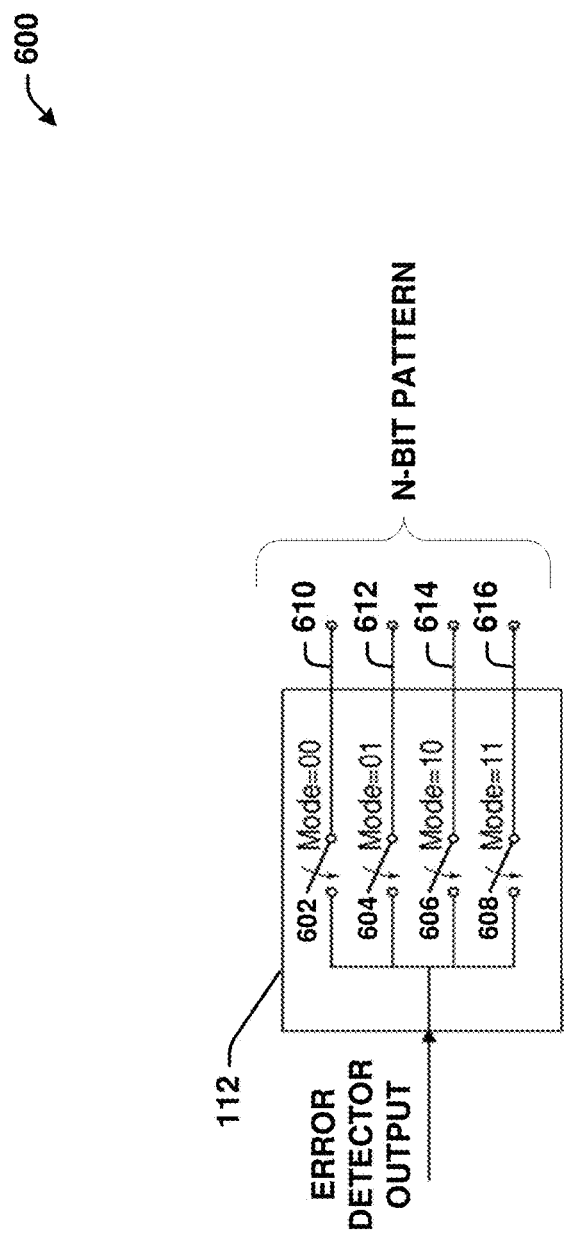
FIG. 6 illustrates an example, non-limiting embodiment of a digital logic circuit in accordance with various aspects described herein.

Referring now to FIG. 6, a block diagram illustrating an example, non-limiting embodiment of a system 600 in accordance with various aspects described herein is shown. The system 600 includes the digital logic circuit 112. The digital logic circuit 112 can include a switch 602, a switch 604, a switch 606 and a switch 608. The digital logic circuit 112 can receive the error detector output generated by the error detector circuit 110. For example, the digital logic circuit 112 can receive an N-bit pattern associated with the error detector output generated by the error detector circuit 110. Based on the error detector output, the digital logic circuit 112 can generate the N-bit pattern provided to the quadrature error correction circuit 114, the quadrature error correction circuit 115, the duty cycle correction circuit 116 and/or the duty cycle correction circuit 117. For instance, based on the error detector output, the digital logic circuit 112 can configure the switch 602, the switch 604, the switch 606 and the switch 608 to generate the N-bit pattern provided to the quadrature error correction circuit 114, the quadrature error correction circuit 115, the duty cycle correction circuit 116 and/or the duty cycle correction circuit 117. In an aspect, the digital logic circuit 112 can open or close the switch 602, open or close the switch 604, open or close the switch 606, and open or close the switch 608 based on the error detector output. In another aspect, the digital logic circuit 112 can be a demultiplexer that connects input associated with the error detector output to one of the outputs associated with the N-bit pattern based on a mode of operation for the quadrature error correction circuit 114, the quadrature error correction circuit 115, the duty cycle correction circuit 116 and/or the duty cycle correction circuit 117. For example, output 610 of the digital logic circuit 112 that is associated with the error detector output (e.g., an N-bit pattern provided by the error detector output) can be provided to the duty cycle correction circuit 116 during a first mode of operation (e.g., Mode=00), output 612 of the digital logic circuit 112 that is associated with the error detector output (e.g., an N-bit pattern provided by the error detector output) can be provided to the duty cycle correction circuit 117 during a second mode of operation (e.g., Mode=01), output 614 of the digital logic circuit 112 that is associated with the error detector output (e.g., an N-bit pattern provided by the error detector output) can be provided to the quadrature error correction circuit 114 during a third mode of operation (e.g., Mode=10), and output 616 of the digital logic circuit 112 that is associated with the error detector output (e.g., an N-bit pattern provided by the error detector output) can be provided to the quadrature error correction circuit 115 during a fourth mode of operation (e.g., Mode=11).

Figure 7:
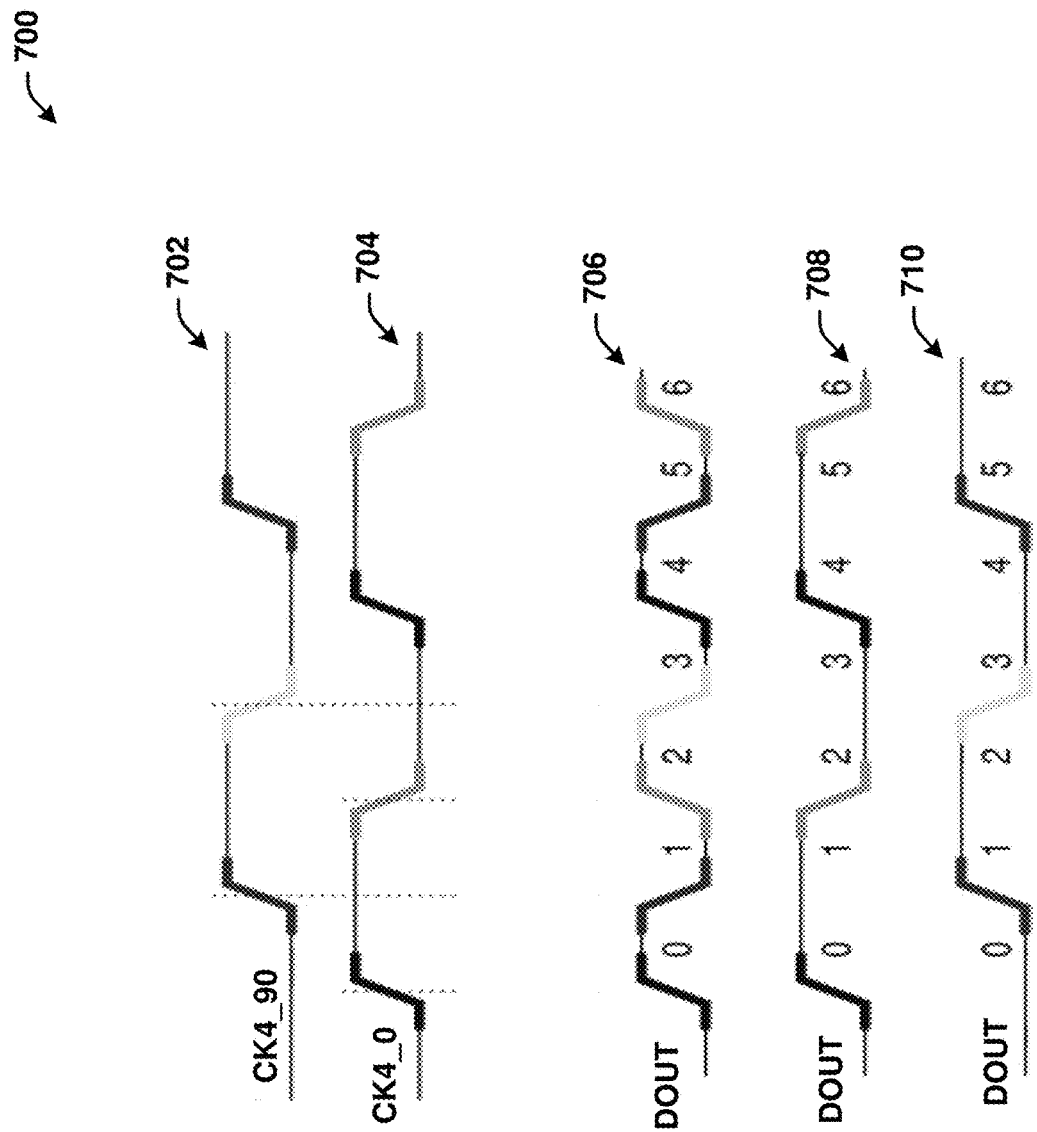
FIG. 7 illustrates another example, non-limiting embodiment of a timing diagram in accordance with various aspects described herein.

Referring now to FIG. 7, an example, non-limiting embodiment of a timing diagram 700 in accordance with various aspects described herein is shown. The timing diagram 700 includes timing data 702 for a clock signal CK4_90. The clock signal CK4_90 can be, for example, a clock signal included in the one or more clock signals provided to the multiplexer core 104 of the transmitter 102. The timing diagram 700 also includes timing data 704 for a clock signal CK4_0. The clock signal CK4_0 can be, for example, another clock signal included in the one or more clock signals provided to the multiplexer core 104 of the transmitter 102. The timing diagram 700 also includes timing data 706 for output data stream DOUT. The output data stream DOUT associated with the timing data 706 can be, for example, an output data stream generated by the multiplexer core 104 of the transmitter 102. For example, the output data stream DOUT associated with the timing data 706 can correspond to the output data stream DOUTP and/or the output data stream DOUTM. In an example, the timing data 706 can be represented by a bit pattern "1010". The timing diagram 700 also includes timing data 708 for output data stream DOUT. The output data stream DOUT associated with the timing data 708 can be, for example, an output data stream generated by the multiplexer core 104 of the transmitter 102. For example, the output data stream DOUT associated with the timing data 708 can correspond to the output data stream DOUTP and/or the output data stream DOUTM. In an example, the timing data 708 can be represented by a bit pattern "1100". The timing diagram 700 also includes timing data 710 for output data stream DOUT. The output data stream DOUT associated with the timing data 710 can be, for example, an output data stream generated by the multiplexer core 104 of the transmitter 102. For example, the output data stream DOUT associated with the timing data 710 can correspond to the output data stream DOUTP and/or the output data stream DOUTM. In an example, the timing data 710 can be represented by a bit pattern "0110".

In certain embodiments, aspects of the systems, apparatuses or processes explained in this disclosure (e.g., aspects of the system 100, the system 200, the system 300, the system 400, the system 500 and/or the system 600) can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. For example, a system (e.g., the system 100, the system 200, the system 300, the system 400, the system 500 and/or the system 600) can include a memory for storing computer executable components and instructions. Furthermore, the system (e.g., the system 100, the system 200, the system 300, the system 400, the system 500 and/or the system 600) can include a processor to facilitate operation of the instructions (e.g., computer executable components and instructions) by the system.

Figure 8:
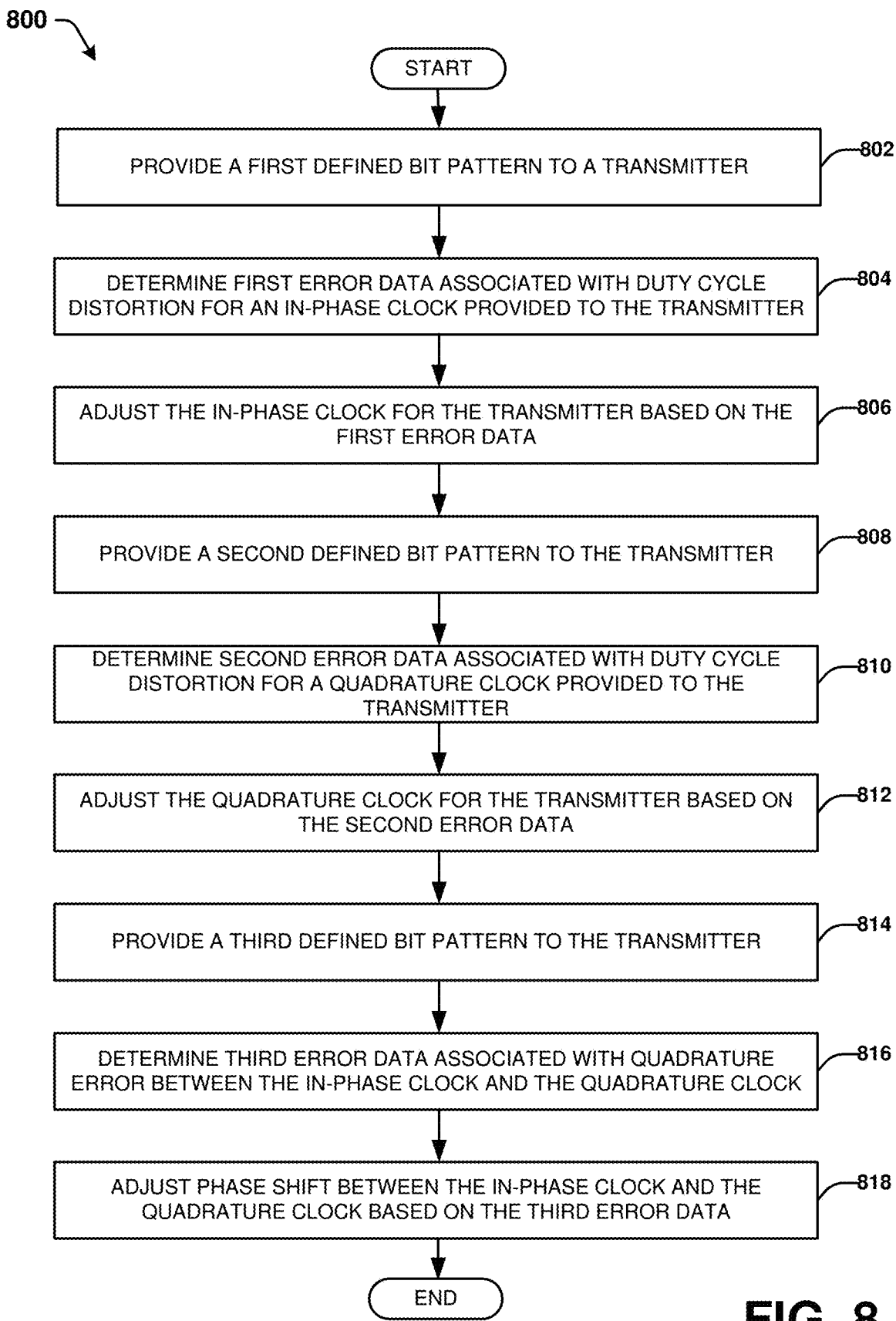
FIG. 8 illustrates a flow diagram of an example, non-limiting embodiment of a method for error detection and compensation for a multiplexing transmitter.
Figure 9A:
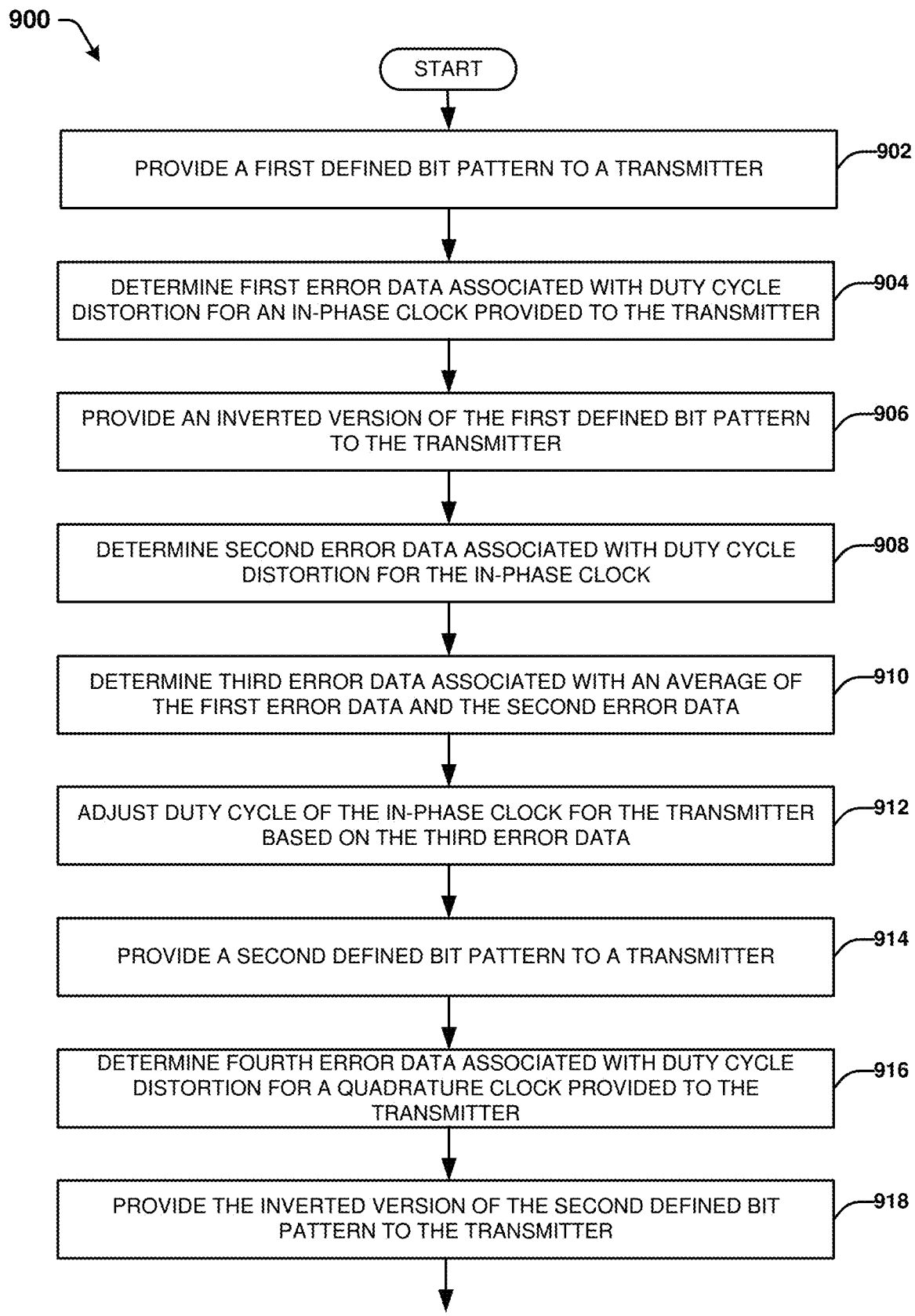
FIGS. 9A-B illustrate a flow diagram of another example, non-limiting embodiment of a method for error detection and compensation for a multiplexing transmitter.
Figure 9B:
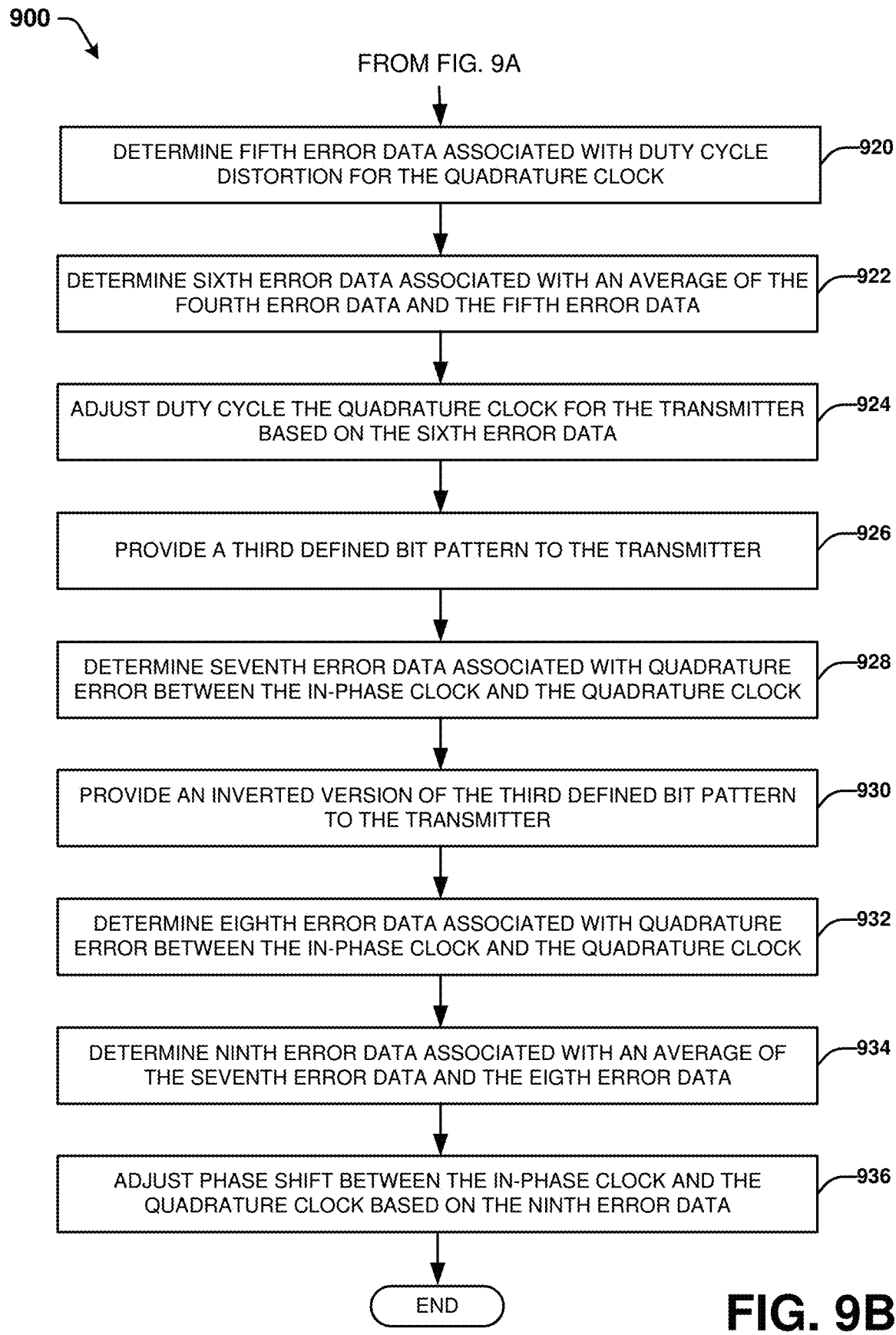

In view of the example systems described above, methods that may be implemented in accordance with the described subject matter may be better appreciated with reference to the flow charts of FIG. 8 and FIGS. 9A and 9B. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 8, a flow diagram of an example, non-limiting embodiment of a method 800 for error detection and compensation for a multiplexing transmitter is shown. Method 800 can begin at block 802, where a first defined bit pattern is provided (e.g., by serializer 108) to a transmitter. For example, the first defined bit pattern can be a "1100" bit pattern. In an embodiment, the first defined bit pattern can be provided to the transmitter during a calibration mode for the transmitter. The transmitter can include, for example, a multiplexer core that receives the first defined bit pattern. In certain embodiments, the transmitter can receive the first defined bit pattern via a set of data signals.

At block 804, first error data associated with duty cycle distortion for an in-phase clock provided to the transmitter is determined (e.g. by error detector circuit 110 and/or digital logic circuit 112). For example, an in-phase clock pattern for output generated by the transmitter in response to the first defined bit pattern can be analyzed to determine duty cycle distortion for the in-phase clock. In an embodiment, the first error data can include a measurement of duty cycle distortion associated with the in-phase clock pattern for output generated by the transmitter. Additionally or alternatively, the first error data can include an N-bit pattern that can be employed as feedback to adjust in-phase clock duty cycle to compensate for the duty cycle distortion.

At block 806, the in-phase clock for the transmitter is adjusted (e.g., by duty cycle correction circuit 116 and/or duty cycle correction circuit 117) based on the first error data. For example, a threshold voltage for a CML-CMOS converter can be adjusted based on the first error data to adjust duty cycle for the in-phase clock provided to the transmitter.

At block 808, a second defined bit pattern is provided (e.g., by serializer 108) to the transmitter. For example, the second defined bit pattern can be a "0110" bit pattern. In an embodiment, the second defined bit pattern can be provided to the transmitter during the calibration mode for the transmitter. In certain embodiments, the transmitter can receive the second defined bit pattern via a set of data signals.

At block 810, second error data associated with duty cycle distortion for a quadrature clock provided to the transmitter is determined (e.g. by error detector circuit 110 and/or digital logic circuit 112). For example, a quadrature clock pattern for output generated by the transmitter in response to the second defined bit pattern can be analyzed to determine duty cycle distortion for the quadrature clock. In an embodiment, the second error data can include a measurement of duty cycle distortion associated with the quadrature clock pattern for output generated by the transmitter. Additionally or alternatively, the second error data can include an N-bit pattern that can be employed as feedback to adjust quadrature clock duty cycle to compensate for the duty cycle distortion.

At 812, the quadrature clock for the transmitter is adjusted (e.g., by duty cycle correction circuit 116 and/or duty cycle correction circuit 117) based on the second error data. For example, a threshold voltage for a CML-CMOS converter can be adjusted based on the second error data to adjust duty cycle for the quadrature clock provided to the transmitter.

At 814, a third defined bit pattern is provided (e.g., by serializer 108) to the transmitter. For example, the third defined bit pattern can be a "1010" bit pattern. In an embodiment, the third defined bit pattern can be provided to the transmitter during the calibration mode for the transmitter. In certain embodiments, the transmitter can receive the third defined bit pattern via a set of data signals.

At 816, third error data associated with quadrature error between the in-phase clock and the quadrature clock is determined (e.g. by error detector circuit 110 and/or digital logic circuit 112). For example, an in-phase clock pattern for output generated by the transmitter in response to the third defined bit pattern can be compared to a quadrature clock pattern for the output generated by the transmitter in response to the third defined bit pattern to determine the quadrature error. In an embodiment, the third error data can include a measurement of quadrature error associated with the in-phase clock pattern and the quadrature clock pattern. Additionally or alternatively, the third error data can include an N-bit pattern that can be employed as feedback for a phase interpolator to compensate for the quadrature error.

At 818, phase shift between the in-phase clock and the quadrature clock is adjusted (e.g., by quadrature error correction circuit 114 and/or quadrature error correction circuit 115) based on the third error data. For example, a Q-clock phase interpolator value for a phase interpolator can be adjusted based on the third error data to compensate for the quadrature error.

Referring to FIG. 9A, a flow diagram of an example, non-limiting embodiment of a method 900 for error detection and compensation for a multiplexing transmitter is shown. Method 900 can begin at block 902, where a first defined bit pattern is provided (e.g., by serializer 108) to a transmitter. For example, the first defined bit pattern can be a "1100" bit pattern. In an embodiment, the first defined bit pattern can be provided to the transmitter during a calibration mode for the transmitter. The transmitter can include, for example, a multiplexer core that receives the first defined bit pattern. In certain embodiments, the transmitter can receive the first defined bit pattern via a set of data signals.

At block 904, first error data associated with duty cycle distortion for an in-phase clock provided to the transmitter is determined (e.g. by error detector circuit 110 and/or digital logic circuit 112). For example, an in-phase clock pattern for output generated by the transmitter in response to the first defined bit pattern can be analyzed to determine duty cycle distortion for the in-phase clock. In an embodiment, the first error data can include a measurement of duty cycle distortion associated with the in-phase clock pattern for output generated by the transmitter. Additionally or alternatively, the first error data can include an N-bit pattern that can be employed as feedback to adjust in-phase clock duty cycle to compensate for the duty cycle distortion.

At block 906, an inverted version of the first defined bit pattern is provided (e.g., by serializer 108) to the transmitter. For example, the inverted version of the first defined bit pattern can be a "0011" bit pattern. In an embodiment, the inverted version of the first defined bit pattern can be provided to the transmitter during the calibration mode for the transmitter. In certain embodiments, the transmitter can receive the inverted version of the first defined bit pattern via a set of data signals.

At block 908, second error data associated with duty cycle distortion for an in-phase clock provided to the transmitter is determined (e.g. by error detector circuit 110 and/or digital logic circuit 112). For example, an in-phase clock pattern for output generated by the transmitter in response to the inverted version of the first defined bit pattern can be analyzed to determine duty cycle distortion for the in-phase clock. In an embodiment, the first error data can include a measurement of duty cycle distortion associated with the inverted version of the in-phase clock pattern for output generated by the transmitter. Additionally or alternatively, the first error data can include an N-bit pattern that can be employed as feedback to adjust in-phase clock duty cycle to compensate for the duty cycle distortion.

At 910, third error data associated with an average of the first error data and the second error data is determined (e.g., by error detector circuit 110 and/or digital logic circuit 112).

At 912, duty cycle of the in-phase clock for the transmitter is adjusted (e.g., by duty cycle correction circuit 116 and/or duty cycle correction circuit 117) based on the third error data. For example, a threshold voltage for a CML-CMOS converter can be adjusted based on the third error data to adjust duty cycle for the in-phase clock provided to the transmitter.

At 914, a second defined bit pattern is provided (e.g., by serializer 108) to the transmitter. For example, the second defined bit pattern can be a "0110" bit pattern. In an embodiment, the second defined bit pattern can be provided to the transmitter during the calibration mode for the transmitter. In certain embodiments, the transmitter can receive the second defined bit pattern via a set of data signals.

At 916, fourth error data associated with duty cycle distortion for a quadrature clock provided to the transmitter is determined (e.g. by error detector circuit 110 and/or digital logic circuit 112). For example, a quadrature clock pattern for output generated by the transmitter in response to the second defined bit pattern can be analyzed to determine duty cycle distortion for the quadrature clock. In an embodiment, the fourth error data can include a measurement of duty cycle distortion associated with the quadrature clock pattern for output generated by the transmitter. Additionally or alternatively, the fourth error data can include an N-bit pattern that can be employed as feedback to adjust quadrature clock duty cycle to compensate for the duty cycle distortion.

At 918, the inverted version of the second defined bit pattern is provided (e.g., by serializer 108) to the transmitter. For example, the inverted version of the second defined bit pattern can be the "1001" bit pattern. In an embodiment, the inverted version of the second defined bit pattern can be provided to the transmitter during the calibration mode for the transmitter. In certain embodiments, the transmitter can receive the inverted version of the second defined bit pattern via a set of data signals.

Referring now to FIG. 9B, the flow diagram of the example, non-limiting embodiment of the method 900 is further shown. The method 900 can continue at block 920, where fifth error data associated with duty cycle distortion for the quadrature clock provided to the transmitter is determined (e.g. by error detector circuit 110 and/or digital logic circuit 112). For example, a quadrature clock pattern for output generated by the transmitter in response to the inverted version of the second defined bit pattern can be analyzed to determine duty cycle distortion for the quadrature clock. In an embodiment, the fifth error data can include a measurement of duty cycle distortion associated with the quadrature clock pattern for output generated by the transmitter. Additionally or alternatively, the fifth error data can include an N-bit pattern that can be employed as feedback to adjust quadrature clock duty cycle to compensate for the duty cycle distortion.

At 922, sixth error data associated with an average of the fourth error data and the fifth error data is determined (e.g., by error detector circuit 110 and/or digital logic circuit 112).

At 924, duty cycle of the quadrature clock for the transmitter is adjusted (e.g., by duty cycle correction circuit 116 and/or duty cycle correction circuit 117) based on the sixth error data. For example, a threshold voltage for a CML-CMOS converter can be adjusted based on the sixth error data to adjust duty cycle for the quadrature clock provided to the transmitter.

At 926, a third defined bit pattern is provided (e.g., by serializer 108) to the transmitter. For example, the third defined bit pattern can be a "1010" bit pattern. In an embodiment, the third defined bit pattern can be provided to the transmitter during the calibration mode for the transmitter. In certain embodiments, the transmitter can receive the third defined bit pattern via a set of data signals.

At 928, seventh error data associated with quadrature error between the in-phase clock and the quadrature clock is determined (e.g. by error detector circuit 110 and/or digital logic circuit 112). For example, an in-phase clock pattern for output generated by the transmitter in response to the third defined bit pattern can be compared to a quadrature clock pattern for the output generated by the transmitter in response to the third defined bit pattern to determine the quadrature error. In an embodiment, the seventh error data can include a measurement of quadrature error associated with the in-phase clock pattern and the quadrature clock pattern. Additionally or alternatively, the seventh error data can include an N-bit pattern that can be employed as feedback for a phase interpolator to compensate for the quadrature error.

At 930, an inverted version of the third defined bit pattern is provided (e.g., by serializer 108) to the transmitter. For example, the inverted version of the third defined bit pattern can be a "0101" bit pattern. In an embodiment, the inverted version of the third defined bit pattern can be provided to the transmitter during the calibration mode for the transmitter. In certain embodiments, the transmitter can receive the inverted version of the third defined bit pattern via a set of data signals.

At 932, eighth error data associated with quadrature error between the in-phase clock and the quadrature clock is determined (e.g. by error detector circuit 110 and/or digital logic circuit 112). For example, an in-phase clock pattern for output generated by the transmitter in response to the inverted version of the third defined bit pattern can be compared to a quadrature clock pattern for the output generated by the transmitter in response to the inverted version of the third defined bit pattern to determine the quadrature error. In an embodiment, the eighth error data can include a measurement of quadrature error associated with the in-phase clock pattern and the quadrature clock pattern. Additionally or alternatively, the eighth error data can include an N-bit pattern that can be employed as feedback for a phase interpolator to compensate for the quadrature error.

At 934, ninth error data associated with an average of the seventh error data and the eighth error data is determined (e.g., by error detector circuit 110 and/or digital logic circuit 112).

At 936, phase shift between the in-phase clock and the quadrature clock is adjusted (e.g., by quadrature error correction circuit 114 and/or quadrature error correction circuit 115) based on the ninth error data. For example, a Q-clock phase interpolator value for a phase interpolator can be adjusted based on the ninth error data to compensate for the quadrature error.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for reducing error associated with a multiplexing transmitter, comprising:
an error detector circuit configured to measure a duty cycle error for a clock associated with a transmitter to generate first error detector information based on a first clock pattern for a first output generated by the transmitter in response to a defined bit pattern, and generate second error detector information based on a second clock pattern for a second output generated by the transmitter in response to an inverted version of the defined bit pattern, wherein the error detector circuit is further configured to determine a first average value of the first error detector information and a second average value of the second error detector information, determine a differential average value of the first average value and the second average value based on a comparison of the first average value to the second average value, and determine an error detector output based on the differential average value; and
a duty cycle correction circuit configured to adjust the clock associated with the transmitter based on the error detector output.

2. The system of claim 1, wherein the error detector circuit is configured to measure the duty cycle error for an in-phase clock associated with the transmitter to generate the error detector output based on an in-phase clock pattern for an output generated by the transmitter in response to the defined bit pattern.

3. The system of claim 1, wherein the error detector circuit is configured to measure the duty cycle error for a quadrature clock associated with the transmitter to generate the error detector output based on a quadrature clock pattern for an output generated by the transmitter in response to the defined bit pattern.

4. The system of claim 1, wherein the error detector circuit is configured to measure a quadrature error between an in-phase clock and a quadrature clock in response to the defined bit pattern.

5. The system of claim 4, further comprising a quadrature error correction circuit configured to adjust a phase shift between the in-phase clock and the quadrature clock based on the quadrature error.

6. The system of claim 1, wherein the error detector circuit is configured to comprise an accumulator, the accumulator configured to accumulate differential average values, comprising the differential average value, based on a first error detector stream and a second error detector stream, and convert the differential average values to generate the error detector output, wherein the first error detector stream is generated based on the defined bit pattern and comprises the first error detector information, and wherein the second error detector stream is generated based on the inverted version of the defined bit pattern and comprises the second error detector information.

7. The system of claim 6, wherein the accumulator is configured to generate the error detector output, comprising an error detector output pattern, based on the conversion of the differential average values.

8. The system of claim 1, wherein the duty cycle correction circuit is configured to adjust the clock based on the differential average value determined from the comparison of the first average value of the first error detector information and the second average value of the second error detector information.

9. A method, comprising:
providing a first defined bit pattern to a transmitter;
determining first error data associated with a first duty cycle distortion for an in-phase clock provided to the transmitter based on the first defined bit pattern;
determining second error data associated with the first duty cycle distortion for the in-phase clock provided to the transmitter based on an inverted version of the first defined bit pattern;
determining a first average value of the first error data and a second average value of the second error data;
determining a differential average value of the first average value and the second average value based on a result of a comparison of the first average value with the second average value;
determining third error data based on the differential average value;
adjusting the in-phase clock for the transmitter based on the third error data; and
adjusting a quadrature clock for the transmitter based on fourth error data associated with a second duty cycle distortion for the quadrature clock that is determined in response to a second defined bit pattern provided to the transmitter.

10. The method of claim 9, further comprising:
providing a third bit pattern to the transmitter.

11. The method of claim 9, further comprising:
determining fifth error data associated with a quadrature error between the in-phase clock and the quadrature clock.

12. The method of claim 11, further comprising:
adjusting a phase shift between the in-phase clock and the quadrature clock based on the fifth error data.

* * * * *